United States Patent
Ding

(10) Patent No.: US 7,359,839 B2
(45) Date of Patent: *Apr. 15, 2008

(54) DATA PROCESSING APPARATUS AND SCHEME FOR SIGNAL MEASUREMENT

(75) Inventor: Rong-Hwa Ding, Jubei (TW)

(73) Assignee: Solid State System Co., Ltd., Hsinchu (TW)

(*) Notice: Subject to any disclaimer, the term of this patent is extended or adjusted under 35 U.S.C. 154(b) by 450 days.

This patent is subject to a terminal disclaimer.

(21) Appl. No.: 11/079,993

(22) Filed: Mar. 14, 2005

(65) Prior Publication Data

US 2006/0015551 A1    Jan. 19, 2006

Related U.S. Application Data

(63) Continuation-in-part of application No. 10/890,929, filed on Jul. 13, 2004.

(51) Int. Cl.
G06F 15/00    (2006.01)

(52) U.S. Cl. .................... 702/198; 702/107; 702/189

(58) Field of Classification Search ............... 702/189, 702/198, 186, 107; 708/490; 348/738
See application file for complete search history.

(56) References Cited

U.S. PATENT DOCUMENTS 5,383,911 A *    1/1995    Mann ......................... 607/19
2003/0002698 A1*  1/2003    Ludvigsen ................. 381/314

* cited by examiner

*Primary Examiner*—Bryan Bui
(74) *Attorney, Agent, or Firm*—J.C. Patents

(57) ABSTRACT

A measure system for signal measurement is introduced. The measure system simplifies the effort for a signal measurement in many applications. The application for a signal measurement is, for example, computation of a signal average value. The measure system includes a digital computation circuit together with an analog to digital converter (ADC) to constitute a compact signal measurement component. With the proposed design, a general microcontroller can proceed with a signal level sense and control with very few CPU power. In addition, the proposed system can be integrated with other analog or digital signal processing circuitry to form a single silicon chip.

19 Claims, 7 Drawing Sheets

DATA PROCESSING APPARATUS AND SCHEME FOR SIGNAL MEASUREMENT

CROSS-REFERENCE TO RELATED APPLICATION

This application is a continuation-in-part application of U.S. patent application entitled "AUDIO SYSTEM CIRCUITRY FOR AUTOMATICAL SOUND LEVEL CONTROL AND A TELEVISION THEREWITH" filed on Jul. 13, 2004, Ser. No. 10/890,929. All disclosures of these applications are incorporated herein by reference.

BACKGROUND OF THE INVENTION

1. Field of the Invention

The invention relates in general to a data processing apparatus and a scheme for data processing, and more particularly, to a digital data processing unit and a scheme for signal measurement.

2. Related Art of the Invention

A data processing unit adaptive for signal measurement is common used in electronic devices. For example, an analog television (TV) broadcasting environment, due to different settings in different TV stations, a sound level from each of the TV stations may vary in a wide range. For general users, it may cause annoying experience since the sound level in the TV stations may change a lot when a user switches channels from one to the other. In addition, switching among different audio input signals in an audio amplifier may have similar problem. In such case, a data processing unit for signal measurement is provided which includes an analog to digital converter (ADC) in the TV or audio station to measure the outputs of the ADC for concurrently controlling the sound level from the TV or audio station. However, the conventional data processing unit for signal measurement need heavy computation and will occupy much of the resource of the MCU.

SUMMARY OF THE INVENTION

Accordingly, one object of the present invention is to provide a data processing unit for signal measurement and a measure system with the same, which simplifies the effort for signal measurement in many applications.

In one embodiment, the data processing unit provided in the invention for signal measurement of a signal average or a root mean square ("RMS", hereinafter) value and a measure system with the same, which simplifies the effort for signal measurement in many applications.

To achieve these and other advantages and in accordance with the purpose of the invention, as embodied and broadly described herein, the invention provides a data processing apparatus comprises an analog to digital converter, a digital data processing unit and a storage unit. The analog to digital converter is used for sensing signals from a plurality of channels when the channels are turned on and output a sensing result for each of the corresponding channels. The digital data processing unit, connected to the analog to digital converter, is used for performing a calculation upon the sensing result of the corresponding channel corresponding to a predetermined increment of an operation mode and sending out calculation results. A storage unit is used for storing user settings and the calculation results.

In the digital data processing, a period for the calculation is controlled by a start/stop bit or controlled by a count number setting.

In one embodiment of the digital data processing, the calculation comprises two sets of calculation with different programmable periods, wherein one is used for quick adjust and the other is used for fine tune.

In one embodiment of the data processing apparatus, when the operation mode is in an auto scan mode, a portion of the channels are treated as pre-set channels, wherein when the digital data processing unit is switched to perform the calculation upon the sensing results from the pre-set channel, the digital data processing unit performs the calculation upon the predetermined increment. In one embodiment, the calculation is an average calculation for calculating an average value of the signals from each of the channels. In one embodiment, the calculation is an RMS calculation for calculating an RMS value of the signals from each of the channels.

In one embodiment of the data processing apparatus, when the operation mode is in an calculation priority mode, a portion of the channels are treated as pre-set channels, wherein when the digital data processing unit is switched to perform the calculation upon the sensing results from the pre-set channel, the digital data processing unit finishes the calculation before being switched to the next channel. The other portion of the channels which are not the pre-set channels, the digital data processing unit skips the calculation. In one embodiment, the calculation is an average calculation for calculating an average value of the signals from each of the channels. In one embodiment, the calculation is an RMS calculation for calculating an RMS value of the signals from each of the channels.

To achieve these and other advantages and in accordance with the purpose of the invention, as embodied and broadly described herein, the invention provides a scheme for data processing. The scheme includes a microcontroller, an analog to digital converter, a storage unit and a data processing unit. The analog to digital converter is used for sensing signals from a plurality of channels when the channels are turned on and output a sensing result for each of the corresponding channels. The storage unit, connected to the microcontroller, is used for storing data desired to processing parameter setting from the microcontroller and results from the data processing. The data processing unit, connected to the analog to digital converter and the storage unit, is used for performing a calculation upon the sensing result of the plurality of channels in a plurality of operation modes and sending the calculation results to the storage unit. When the data processing unit is not used for performing the calculation upon the sensing result from the analog to digital converter, the data processing unit alternatively performs a calculation upon the data from the microcontroller. The computation functions can be used by the MCU include division, square, square root, average, or RMS calculations and an arbitrary combination thereof.

BRIEF DESCRIPTION OF THE DRAWINGS

These, as well as other features of the present invention will become more apparent upon reference to the drawings as followed.

DETAILED DESCRIPTION OF THE PREFERRED EMBODIMENT

Figure 1:
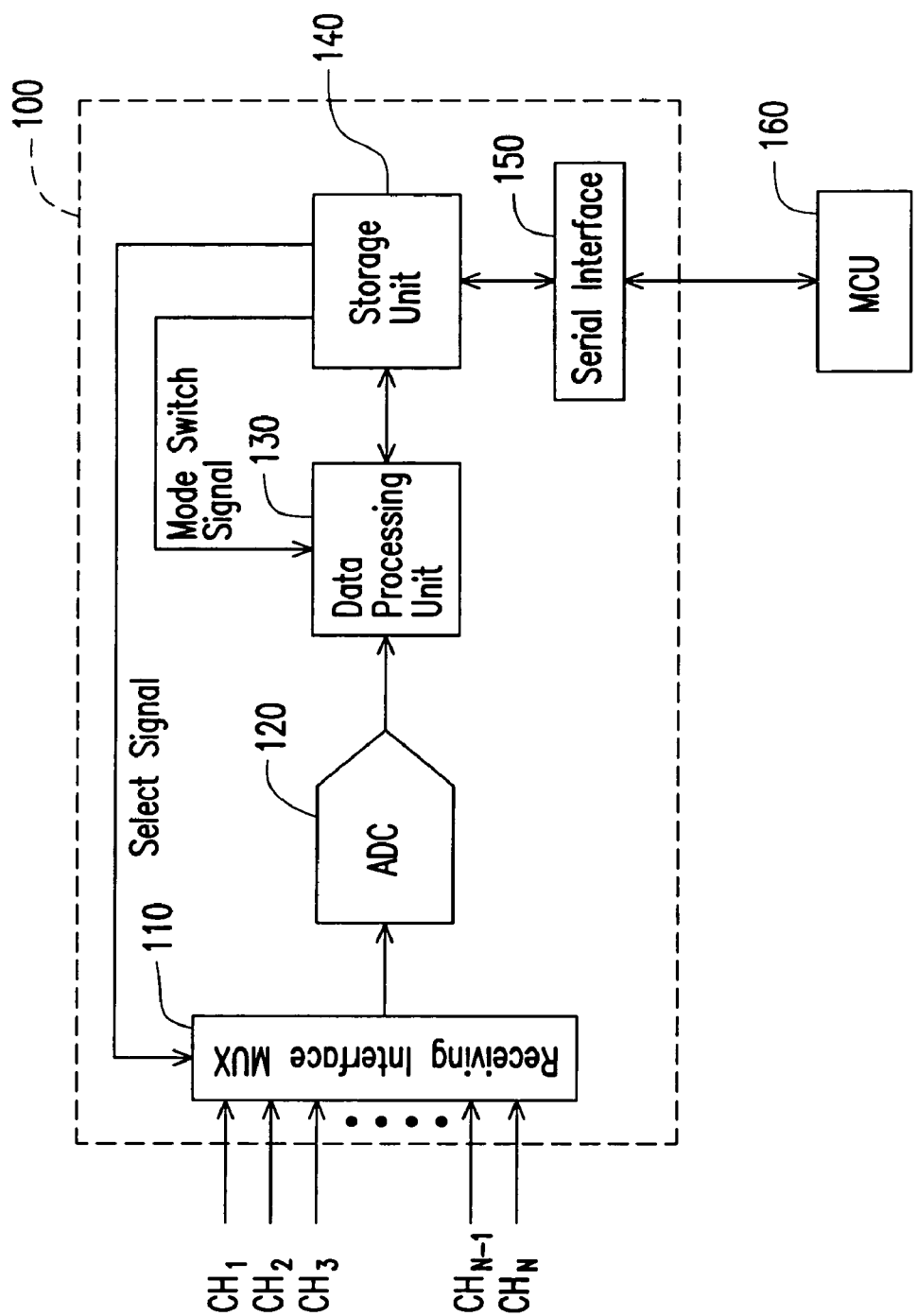
FIG. 1 shows measure system of a preferred embodiment of the present invention.

The invention provides a data processing unit for signal measurement, which simplifies the effort for a signal measurement in many applications. The application for a signal measurement is, for example, computation of a signal average or RMS value. The invention further provides a measure system with a digital data processing unit for signal measurement. In an embodiment, the proposed system includes a digital computation circuit together with an analog to digital converter (ADC) to constitute a compact signal measurement component. With the proposed design, a general microcontroller can proceed with a signal level sense and control with very few CPU power. In addition, the proposed system can be integrated with other analog or digital signal processing circuitry to form a single silicon chip.

For the application of signal voltage measurement, a general calculation is to find an average or a root mean square ("RMS", hereinafter) value of signals which are measured. In addition, another alternative application is to detect a signal with a peak value and to alert when the signal over or under the peak value is detected. However, to proceed with the calculation of the average value, a general microprocessor (MCU) with an analog to digital converter (ADC) must perform addition and then final division operation, which spends so much efforts and resource. To proceed with the calculation of RMS value, a general microprocessor (MCU) with an analog to digital converter (ADC) must perform square operation, addition, square root operation, and then final division operation. If a low cost general purpose MCU is applied to such calculations, it may cause a serious problem of insufficient computation power and data value overflow. Since an 8-bit accumulator is used in a commonly popular 8-bit MCU, data truncation will occur if the calculation result is more than 8 bits, which is very easy to occur for the long data average or RMS calculation. If a more expensive digital signal processing (DSP) circuit is applied to solve the overflow problem, the average or RMS calculation still consumes a certain CPU power, especially for high frequency signal measurement.

With the proposed solution of the present invention, an average or RMS calculation is handled by a hardware accelerator built in an integrated circuit, for example, an ADC component. A low-cost general-purpose MCU can be easily implemented together with the proposed solution of the invention to handle the measurement with a minimum CPU power. In an alternative embodiment, such proposed solution can be easily applied to a high frequency signal measurement with nowadays an advanced foundry manufacturing process. For example, the hardware calculation digital circuit can be easily done in a very high speed, e.g. 100 MHz for 0.25u or 0.18u process. The proposed solution can be applied in many applications; for example, audio signal sound level detection, video signal level detection, power system long time average or RMS measurement, etc.

In an alternative embodiment, because a low-cost general purpose MCU, data calculation capability is very limited, if the digital processing unit for signal measurement is not in use, the embedded calculation capability in the digital processing unit can be utilized by the MCU for computation acceleration. The computation functions can be used by the MCU include division, square, square root, average, or RMS calculations and an arbitrary combination thereof.

Refer to FIG. 1, which shows a measure system 100 of a preferred embodiment of the present invention. The exemplary architecture of the embodiment is used for explaining the invention, but not used to restrict to the scope of the invention. As described above, the architecture can achieve signal measurement, which simplifies the effort for a signal measurement in many applications. In the architecture, the measure system 100 includes a receiving interface multiplexer 110, an analog to digital converter (ADC) 120, a digital data processing unit 130, a storage unit 140 and a serial interface 150.

The receiving interface multiplexer 110 is used for selectively receiving input data from external sources through a plurality of channels $CH_1$, $CH_2$, $CH_3$, ... $CH_{N-1}$ and $CH_N$, which are desired to be measured by a select signal. The number of channels is arbitrary and depends on the applications desired. In the embodiment, these received signals are analog and are, for example, audio signals, voltages or detected signals from the sensors, and so on.

The analog to digital converter (ADC) 120 is used for sense these received signals from the receiving interface multiplexer 110. In an alternative embodiment, the ADC 120 senses these received signals sequentially, and in another embodiment, the ADC 120 sense these received signal in a predetermined order dependent on the application desired. The data processing digital unit 130 is used for performing calculation on the sensed data from the ADC 120 in different modes controlled by a mode switch signal from control registers in storage unit 140. The storage unit 140 is used for storing user settings and calculation results from the data processing digital unit 130. The storage unit 140, for example, can be implemented by a register set in an embodiment.

As explained above, the calculations performed in the data processing digital unit 130 includes a peak value memorizing calculation, a mean value calculation, a RMS calculation, or combination of these calculations. The calculation results stored in the storage unit 140 are transmitted to a microcontroller (MCU) 160 through the serial interface 150. The MCU 160 can simply read the calculation results and make decision depending on the results.

The data processing digital unit 130 performs calculations upon the sensing results from the ADC 120, for example, performs an average or RMS calculation to find an average or RMS value of received signals which are measured in several operation modes. These operation modes include a user program mode, an auto-increment mode, an auto-scan mode or a calculation priority mode. In these modes, the average or RMS calculation period is controlled by, for example, a start/stop bit or by a count number setting, which depends on the applications.

User program mode is a method for multi-channel signal measurement. In the user program mode, input channel select and the average or RMS calculation is manually controlled by a user depending on his decision. For example, in the user program mode, if user selects a channel, for example, CH2, the user must set all the processing steps necessary on the data from the channel $CH_2$ before the user sets the input channel to the other one.

Auto-increment mode is a semi-automatic method for a multi-channel signal measurement, after the user reads a real-time data from one channel, the input multiplexer automatically switches the input channel to the next one on a predetermined order. In this way, the user can simply read data from a sequence of input channels and avoid the step of setting the multiplexer to the next channel after each data read.

In the auto-scan mode, a predetermined increment is decided initially and then the average calculation is performed by bits of the predetermined increment. For example, in the auto-scan mode, if data is respectively transmitted from channels $CH_1 \sim CH_N$, the receiving interface multiplexer 110 will select signals from the channels $CH_1 \sim CH_N$ sequentially and transmit the same to the ADC 120 for conversion. The converted digital signals are then transmitted to the data processing digital unit 130. The data processing digital unit 130 will first perform the average or RMS calculation upon the converted digital signal from the first channel $CH_1$. After bits of the amount of the predetermined increment, the receiving interface multiplexer 110 will change the channel and then the data processing digital unit 130 perform the average or RMS calculation upon the converted digital signal from the second channel $CH_2$. In such an order, each channel will be first performed their own average or RMS calculation for these bits of the amount of the predetermined increment. In another embodiment, such average or RMS calculation unit can be assigned to a few fixed channels instead of all channels. In another embodiment, the average or RMS calculation calculates all the data from several different channels in only one average or RMS calculation. In such a way, an average or RMS value for data from different channels can be calculated. Calculation period for average or RMS calculation in all the above methods can be controlled by setting data count or by start/stop control bits. In another embodiment, the predetermined increment and calculation data length can be different for each channel.

For example, if it is assumed that there are N channels $CH_1 \sim CH_N$ are calculated and the predetermined increment is 32, then after every 32 input data, the receiving interface multiplexer 110 will change to the next channel. That is, the data processing digital unit 130 will first perform the average or RMS calculation for CH1 upon the 32 data of the converted digital signal from the first channel $CH_1$, and then starts the calculation for CH2 upon the 32 data of the converted digital signal from the second channel $CH_2$. By such arrangement, the average or RMS value for each of the channels $CH_1 \sim CH_N$ will sequentially be found out. It is noted that in the practical implementations, the amount of the data for calculation in every channel can be different from the others. The data processing digital unit 130 will perform the average or RMS calculation upon 32 bits from each channel each time until all the average or RMS calculation on these channels have been done. Then the next calculation cycle starts from the first channel again. In another embodiment, for example, only the specific channel CH2 is set to have 2048 data average or RMS but not on the other channels. Then when every time the channel CH2 input data is selected, the 32 data from CH2 is added to the average or RMS calculation and then the multiplexer switches to the next channel. In this way, totally 64 loops is needed to accumulate the 2048 data from the channel CH2 and get the final result. External MCU is only needed to do the initial setting and then read the result. No extra work load is needed from external MCU.

Figure 2:
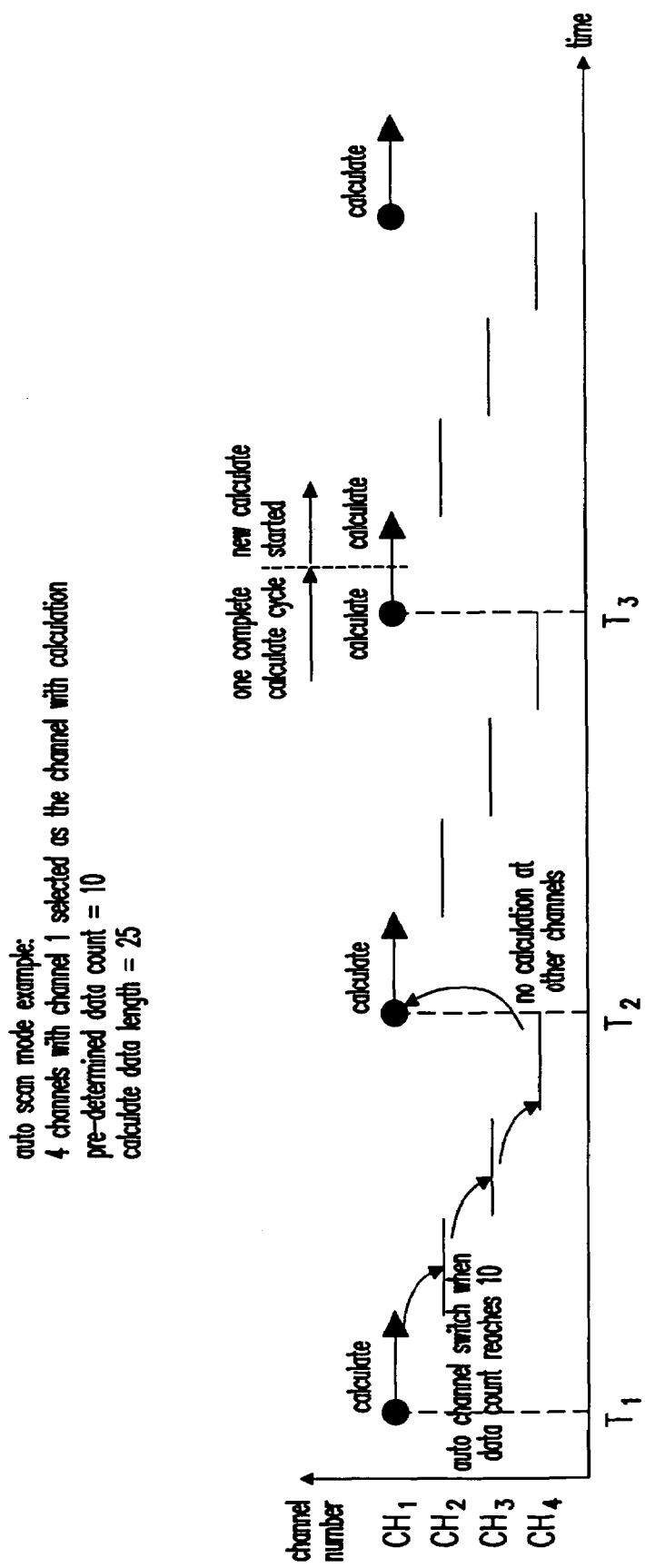
FIG. 2 shows an example for the auto scan mode.

Please refer to FIG. 2, which schematically shows an average or a RMS calculation performed on data from one of four channels $CH_1 \sim CH_4$ in time domain in the auto-scan mode. In an example of the auto-scan mode, the channel $CH_1$ is selected as the channel with calculation. The predetermined data count is equal to 10 and the calculation data length is 25. At time T1, the calculation, either average or RMS calculation, is performed by the measure system at first 10 data received from the channel $CH_1$. When the data count reaches 10, which is the predetermined increment in the auto-scan mode, the measure system automatically switches to the next channel $CH_2$ as shown. By such a manner, when the data count again reaches 10, the measure system automatically switches to the next channel $CH_3$ and then switches to the next channel $CH_4$. At time T2, $CH_1$ is selected again and the calculation for $CH_1$ continues for these 10 data. Then, whenever the data count reaches the predetermined increment 10, the measure system automatically switches to the next channel from $CH_1 \sim CH_4$ in time domain. At time T3, the calculation for CH1 continues again until the data count of 25 is reached. The final result is stored and a new calculation can be automatically started.

In the calculation priority mode, a predetermined increment will also be decided initially as in auto scan mode. However, what is different from the auto-scan mode is that some specific channels can be treated as pre-set channels which the average or RMS calculation should be finished when the specific channel is on before changing to the next channel. For example, in the auto-scan mode, if it is assumed that the predetermined increment is 32 for all channels and there are N channels $CH_1 \sim CH_N$. Specific channels $CH_2$ and $CH_5$ are treated as the pre-set channels with average or RMS calculation for 1024 data. For non-pre-set channels, the data processing digital unit 130 do not perform the average or RMS calculation but only store converted data from ADC and change to the next channel every 32 data. But when the multiplexer unit 110 changes to the channel $CH_2$, the average or RMS calculation for the total 1024 bits will be finished before changing to the next channel. In the same manner, when the multiplexer unit 110 changes to the channel $CH_5$, the average or RMS calculation for the total 1024 bits will be finished before changing to the next channel. It is noted that in the practical implementations, the amount of the data from every channel can be different from the others.

Figure 3:
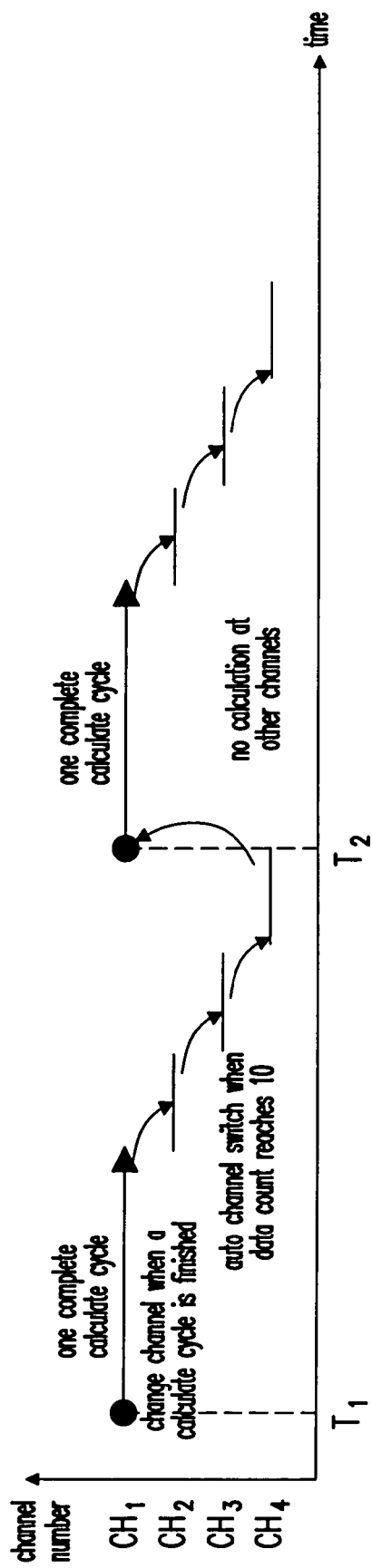
FIG. 3 shows an example for the calculation priority mode.

Please refer to FIG. 3, which schematically shows an average or a RMS calculation performed on data from one of four channels $CH_1 \sim CH_4$ in time domain in the calculation priority mode. In an example of the calculation priority mode, the channel $CH_1$ is selected as the channel with calculation. The predetermined data count is equal to 10 and the calculation data length is 25. At time T1, the calculation, either average or RMS calculation, is performed by the measure system at first 25 data received from the channel $CH_1$. That is, one complete calculate cycle is done for the 25 bits received from the selected channel $CH_1$ in the beginning. Then the measure system switches to the next channel $CH_2$ as shown. When the data count reaches 10, which is the predetermined increment, the measure system switches to the next channel $CH_3$, and when the data count reaches 10 again, the measure system switches to the next channel $CH_4$. By such a manner, when the data count again reaches 10, the measure system switches to the next channel for these channels which are not selected for calculation. At time T2, the calculation is performed by the measure system at 25 data received from the channel $CH_1$ for next one complete calculate cycle.

Figure 4:
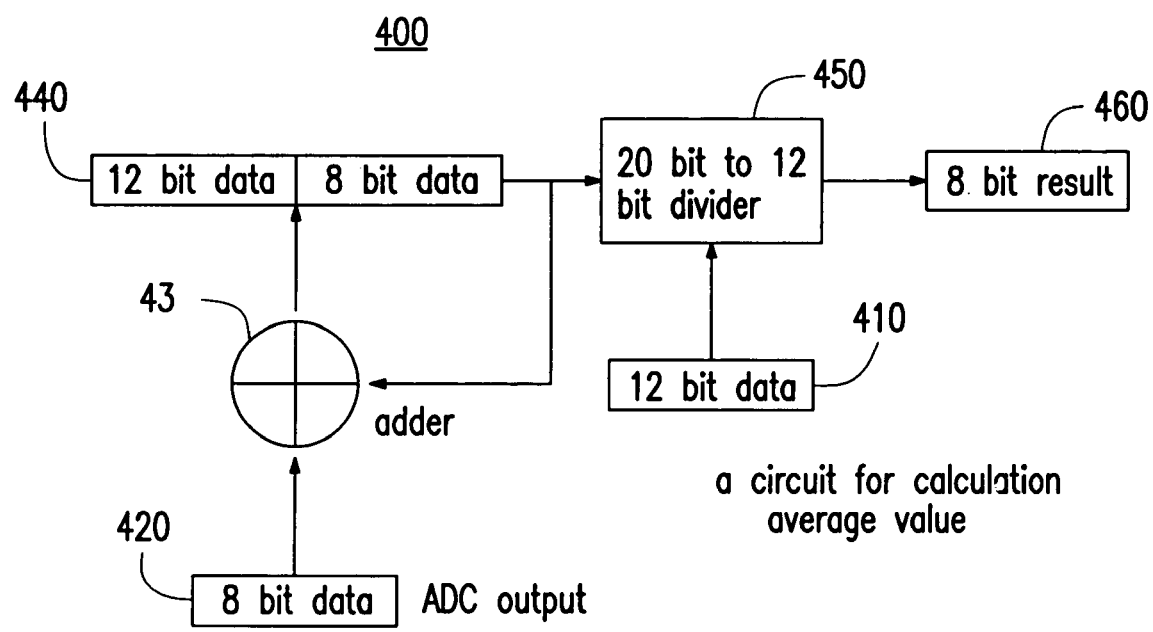
FIG. 4 shows a 1-stage digital data processing unit of a preferred embodiment, which is implemented in the measure system

Refer to FIG. 4, which shows the average calculation of a preferred embodiment implemented in the data processing unit 130 shown in FIG. 1. The data processing digital unit 130 in the embodiment can be implemented by an average calculation circuit 400. A programmable counter, for example, a 12-bit programmable counter 410, stores the length of user programmed calculation length up to 4096. For each data 420 sent from an 8-bit analog to digital converter, an adder 430 performs one add computation and stores the result therefrom in a register, for example, a 20-bit register 440. When the number of add computation reaches the count number in the 12 bit programmable counter 410, the computation result is sent to a divider, for example, a 20-bit to 12-bit divider 450, to divide the addition result by the value in programmable counter. After performing 20-bit to 12-bit dividing, the division computation result is then stored in a register, for example, an 8-bit register 460. Then the computation circuit stopped.

Figure 5:
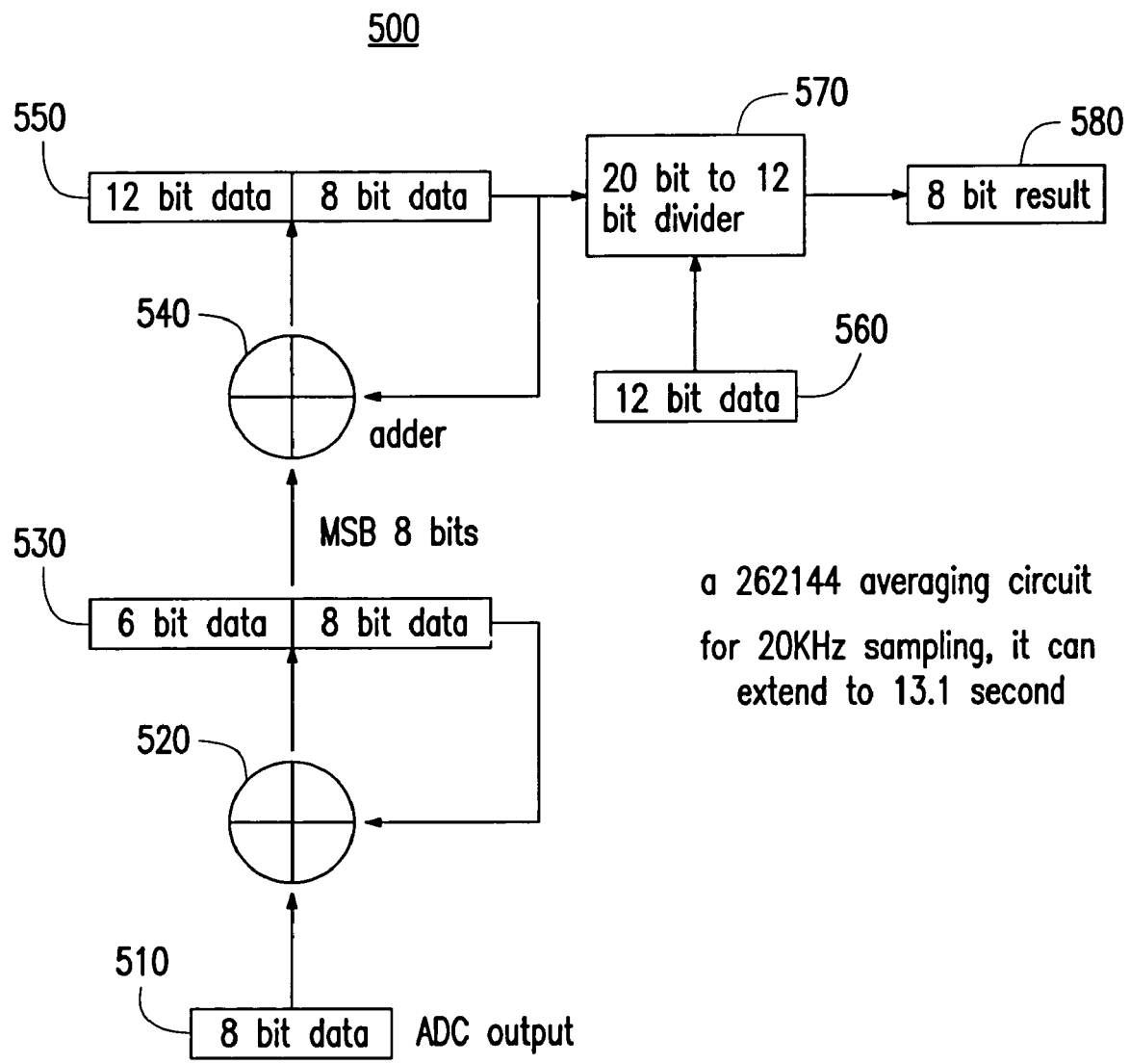
FIG. 5 shows a 2-stage digital data processing unit of a preferred embodiment, which is implemented in the measure system.

Refer to FIG. 5, which shows another preferred embodiment of the digital data processing unit 130 shown in FIG. 1. The digital data processing unit 130 in the embodiment can be implemented by a 2-stage average calculation circuit 500. To have a longer period of averaging calculation, the embodiment in FIG. 5 needs a very large divider circuit since the dividend bit number will be very long. To overcome this problem, a 2-stage circuit can be used. In the first stage circuit for each data 510 sent from an 8-bit analog to digital converter, an adder 520 performs one add computation and stores the result therefrom in a register, for example, a 14-bit register 530. After 64 input data have been calculated, the most significant bits (MSB) 8 bits are sent to the second stage circuit. In the second stage circuit, an adder 540 performs one add computation upon the MSB 8 bits sent from register 530 and the data stored in a register, for example, a 20-bit register 550, and then the computation result therefrom is stored in the 20-bit register 550. When the number of add computation in adder 540 reaches the count number in the 12 bit programmable counter 560, the computation result is sent to a divider, for example, a 20-bit to 12-bit divider 570. After performing 20-bit to 12-bit dividing, the division computation result is then stored in a register, for example, a 8-bit register 580. Then the computation circuit stopped.

For the embodiment of FIG. 5, the first stage is a fixed 64 data average calculation circuit. And its calculation result is sent to the second average calculation circuit. A user programmable counter sets the calculation count for the second average calculation. Therefore, user programmable period has a unit step of 64 data. For the embodiment of FIG. 5, an average calculation capability for up to 262144 data can be reached, which can extend to 13.1 second for a high speed 20 KHz data sampling.

Figure 6:
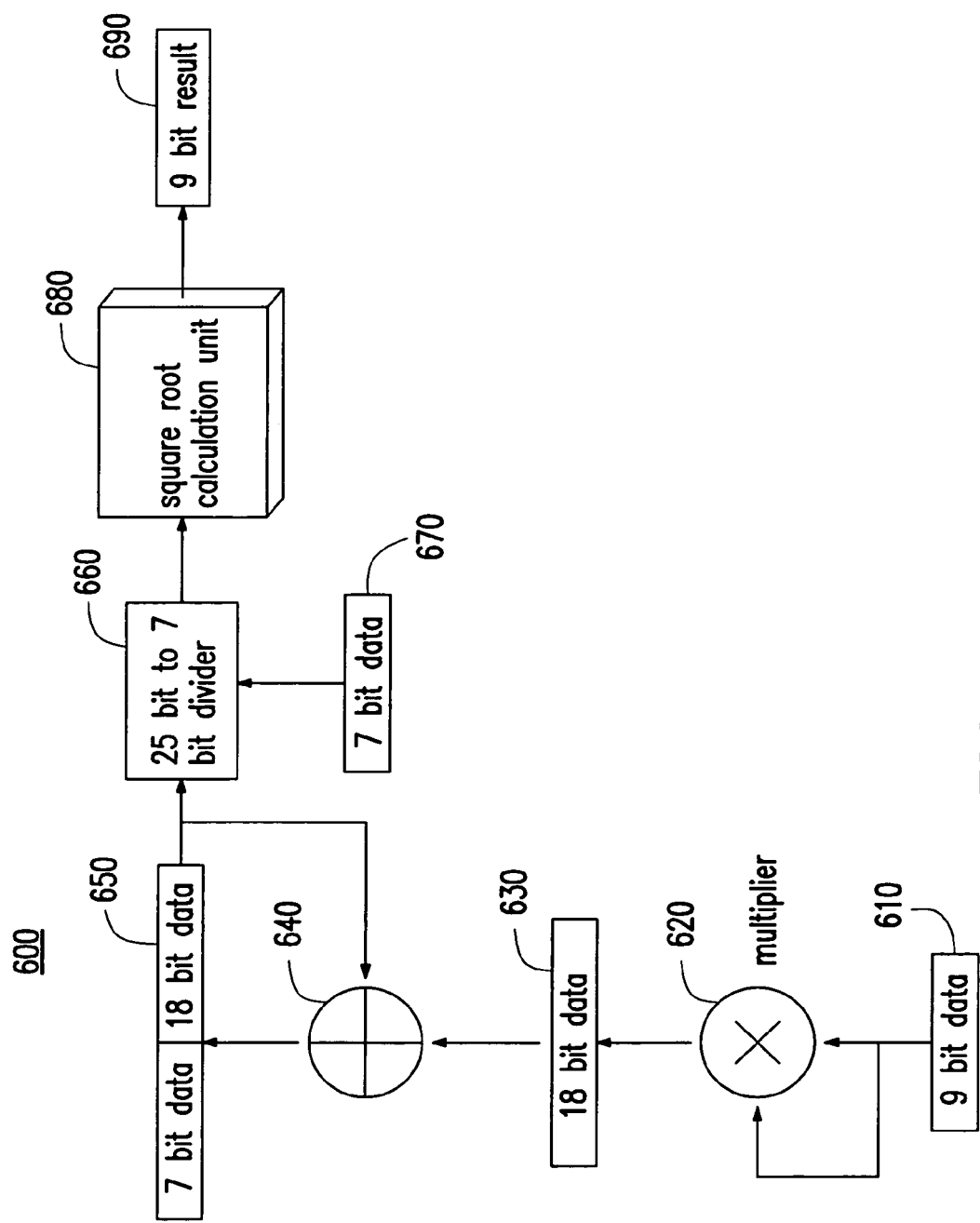
FIG. 6 shows a preferred embodiment for the hardware RMS calculation.

A preferred embodiment of the hardware for performing the RMS calculation is shown in FIG. 6. The above-mentioned RMS calculation for N discrete value from $x_1$ to $x_n$ can be:

$$X_{rms} = \sqrt{\frac{1}{N}\sum_{i=1}^{N} X_i^2} = \sqrt{\frac{X_1^2 + X_2^2 + ... + X_N^2}{N}}$$

This embodiment can calculate the RMS value for up to 128 input data with 9 bit resolution. Refer to FIG. 6, which shows the RMS calculation of a preferred embodiment implemented in the data processing unit 130 shown in FIG. 1. The data processing digital unit 130 in the embodiment can be implemented by an RMS calculation circuit 600. A multiplier 620 receives a 9-bit data from an external source and performs multiplication upon the 9-bit data multiplied by itself to perform a square operation. The output of the multiplier 620 is stored in a register, for example, a 18-bit register 630 as shown in FIG. 6. The data from register 630 is added with the data in register 650 by the adder 640, and transmit the result back to register 650. When a counter 670 which counts the input data number reaches a predetermined number, for example, a 7-bit data count, a start signal is triggered. The data stored in register 650 is sent to a divider, such as the 25 bits to 7 bits divider 660 as shown in FIG. 6. Then a square root calculation unit 680 performs the square root calculation upon the result sent from the divider 660. Then a 9-bit result is obtained from the square root calculation unit 680.

In an embodiment of the invention, control of the average or RMS calculation period is not by user programmable counter, but from a start/stop bit.

As shown in FIG. 1, for a low-cost general purpose MCU 160 such as a 8 bit MCU, data calculation capability is very limited. If the digital processing unit 130 in the measure system 100 is not in use, the embedded calculation capability in the digital processing unit 130 can be utilized by the MCU 160 for computation acceleration. The computation functions can be used by the MCU 160 include division, square, square root, average, and RMS.

Figure 7:
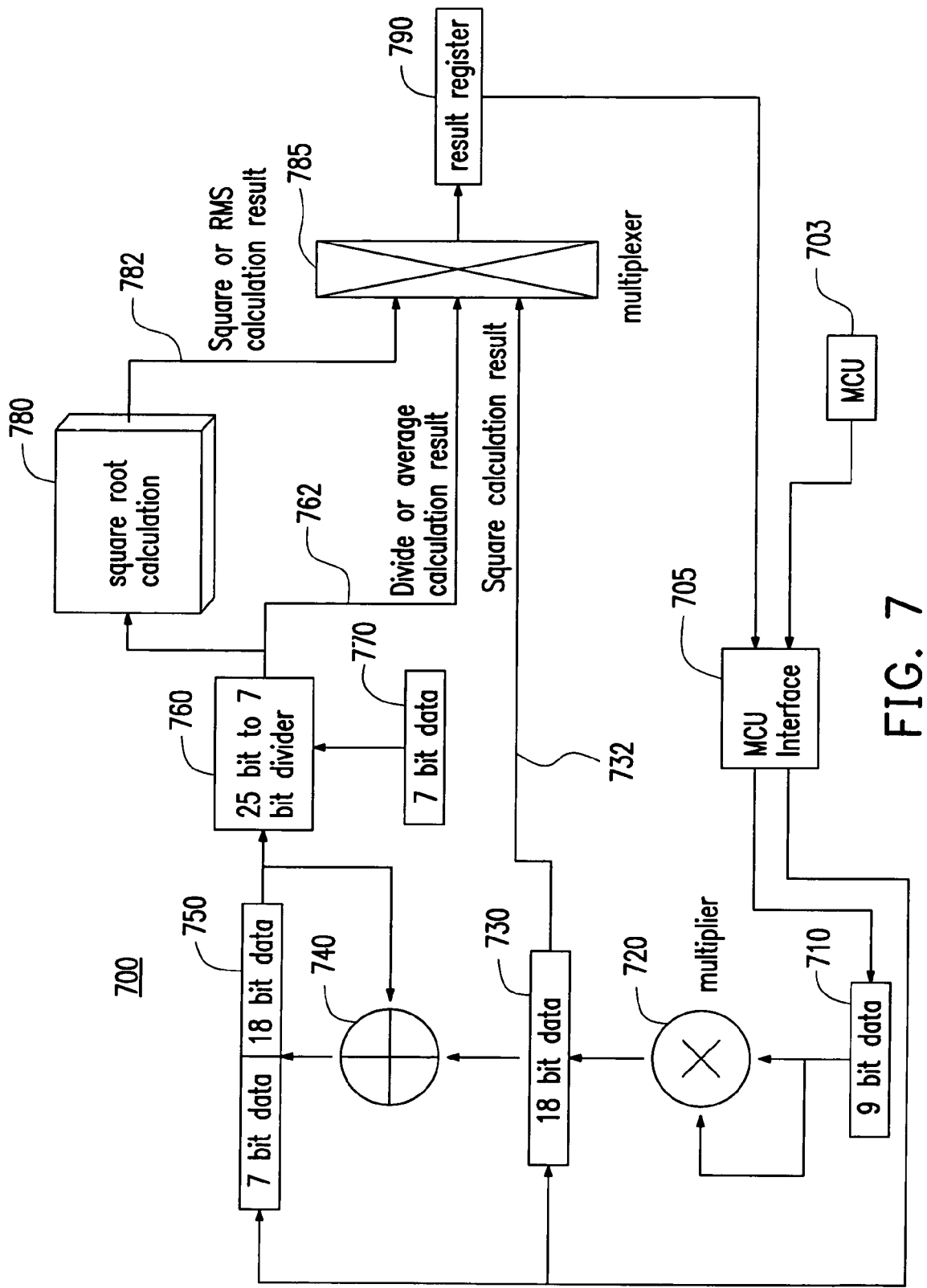
FIG. 7 shows a preferred embodiment of a scheme for data processing of the present invention.

FIG. 7 shows a preferred embodiment of the digital data processing unit which adds additional interface 705 for a MCU 703 access. For a division computation, the MCU 703 writes the dividend to a register 750 and writes divisor to a register 770, and the final division result is received in a register 790 through a multiplexer 785. For a square computation, the MCU 703 writes a data into a register 710 and the result in a register 730 is passed to the register 790 through a multiplexer 785. The MCU 703 can read the result in a register 790. For a square root computation, the MCU 703 writes a value into the register 750 and write 1 to register 770 to bypass the division. And then the result can be read from register 790. For average calculation, for every data write into register 730, a data count is automatically incremented in register 770. An addition is performed to add the input data with accumulated value in register 750, and store the result back to register 750. After all the data has been written, average calculation result can be read from register 790. The average result come from dividing the addition result in register 750 by the data count in register 770. For RMS calculation, for every data write into register 710, a data count is incremented in register 770. The data flow for RMS is similar to that explained in FIG. 6. After all the data has been written, RMS calculation result can be read from register 790.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A data processing apparatus, comprising:
   an analog to digital converter for sensing signals from a plurality of channels when the channels are turned on and output a sensing result for each of the corresponding channels;
   a data processing unit with a hardware circuit, connected to the analog to digital converter, for performing a root mean square (RMS) calculation by the hardware circuit upon the sensing result of the plurality of channels; and a storage unit, for storing user settings and the calculation results;

wherein the RMS calculation comprising two sets of calculation with different programmable periods, wherein one is used for quick adjust and the other is used for fine tune.

2. The data processing apparatus of claim 1, wherein a period far the RMS calculation is controlled by a start/stop bit.

3. The data processing apparatus of claim 1, wherein a period for the RMS calculation is controlled by a count number setting.

4. A data processing apparatus, comprising:

an analog to digital converter for sensing signals from a plurality of channels when the channels are turned on and output a sensing result for each of the corresponding channels;

a data processing unit, connected to the analog to digital converter, for performing a calculation upon the sensing result of the plurality of channels in an auto scan mode, in the auto scan mode, input channel switching is automatically done and, based on a predetermined increment value which can be independently set for each channel, some of the channels are selected for doing the calculation, when one of the selected channels is turn on, data with the predetermined increment value number from the analog to digital converter is performed with calculation and then the input data is automatically switched to the next channel, wherein calculation for each selected channel continues until a total data count is reached and the calculation result is then sent out; and a storage unit, for storing user settings and the calculation results.

5. The data processing apparatus of claim 4, wherein a period for the calculation is controlled by a start/stop bit.

6. The data processing apparatus of claim 4, wherein the calculation comprising two sets of calculation with different programmable periods, wherein one is used for quick adjust and the other is used for fine tune.

7. The data processing apparatus of claim 4, wherein the calculation is an average calculation for calculating an average value of the signals from each of the channels.

8. The data processing apparatus of claim 4, wherein the calculation is a root mean square (RMS) calculation for calculating an RMS value of the signals from each of the channels.

9. A data processing apparatus, comprising:

an analog to digital converter for sensing signals from a plurality of channels when the channels are turned on and output a sensing result for each of the corresponding channels;

a data processing unit, connected to the analog to digital converter, for performing a calculation upon the sensing result of the plurality of channels in a calculation priority mode, wherein in the calculation priority mode, input channel switching is automatically done and, based on a predetermined increment value which can be independently set for each channel, some of the channels are selected for doing the calculation, wherein when one of the selected channels is turn on, the switching to the next channel is not decided by the predetermined increment value but only after the calculation is finished, wherein a calculation period for the calculation is set by a total data count, wherein for the channels not selected for calculation, the switching is still decided by the predetermined increment value; and a storage unit, for storing user settings and the calculation results.

10. The data processing apparatus of claim 9, wherein a period for the calculation is controlled by a start/stop bit.

11. The data processing apparatus of claim 9, wherein the calculation comprising two sets of calculation with different programmable periods, wherein one is used for quick adjust and the other is used for fine tune.

12. The data processing apparatus of claim 9, wherein the calculation is an average calculation for calculating an average value of the signals from each of the channels.

13. The data processing apparatus of claim 9, wherein the calculation is a root mean square (RMS) calculation for calculating an RMS value of the signals from each of the channels.

14. A scheme for data processing, the scheme comprising:

a CPU unit;

an analog to digital converter for sensing signals from a plurality of channels when the channels are turned on and output a sensing result for each of the corresponding channels;

a storage unit, connected to the CPU unit, for storing data desired to processing from the CPU unit and results from the data processing; and a data processing unit, connected to the analog to digital converter and the storage unit, for performing a calculation upon the sensing result of the plurality of channels in a plurality of operation modes and sending the calculation results to the storage unit, when the data processing unit is not used for performing the calculation upon the sensing result from the analog to digital converter, the data processing unit alternatively performs the calculation upon the data written by the CPU unit to registers.

15. The scheme for data processing of claim 14, wherein the calculation upon the data written by the CPU unit to reaisters comprises division computation.

16. The scheme for data processing of claim 14, wherein the calculation upon the data written by the CPU unit to registers comprises square computation.

17. The scheme for data processing of claim 14, wherein the calculation upon the data written by the CPU unit to registers comprises square root computation.

18. The scheme for data processing of claim 14, wherein the calculation upon the data written by the CPU unit to registers comprises average computation.

19. The scheme for data processing of claim 14, wherein the calculation upon the data written by the CPU unit to resisters comprises root mean square (RMS) calculation.

* * * * *